United States Patent
Iwamoto et al.

(10) Patent No.: US 9,261,545 B2
(45) Date of Patent: Feb. 16, 2016

(54) CAPACITANCE VOLTAGE CONVERSION CIRCUIT, INPUT APPARATUS USING THE SAME, ELECTRONIC INSTRUMENT, AND CAPACITANCE VOLTAGE CONVERSION METHOD

(75) Inventors: Yukihiro Iwamoto, Kyoto (JP); Yuji Shimada, Tokyo (JP)

(73) Assignee: ROHM CO., LTD. (JP)

(*) Notice: Subject to any disclaimer, the term of this patent is extended or adjusted under 35 U.S.C. 154(b) by 1046 days.

(21) Appl. No.: 13/367,904

(22) Filed: Feb. 7, 2012

(65) Prior Publication Data

US 2012/0200306 A1 Aug. 9, 2012

(30) Foreign Application Priority Data

Feb. 8, 2011 (JP) .................................. 2011-025019
Aug. 24, 2011 (JP) .................................. 2011-182223

(51) Int. Cl.
*G01R 27/26* (2006.01)
*H03K 17/96* (2006.01)

(52) U.S. Cl.
CPC .......... *G01R 27/2605* (2013.01); *H03K 17/962* (2013.01)

(58) Field of Classification Search
None
See application file for complete search history.

(56) References Cited

U.S. PATENT DOCUMENTS

| | | | | |
|---|---|---|---|---|
| 5,543,588 | A * | 8/1996 | Bisset et al. | 178/18.06 |
| 8,154,310 | B1 * | 4/2012 | Maharyta et al. | 324/686 |
| 2011/0157068 | A1 * | 6/2011 | Parker et al. | 345/174 |
| 2011/0186359 | A1 * | 8/2011 | Chen et al. | 178/18.06 |
| 2011/0187389 | A1 * | 8/2011 | Han et al. | 324/679 |

FOREIGN PATENT DOCUMENTS

JP 2001-325858 A 11/2001

* cited by examiner

*Primary Examiner* — Melissa Koval
*Assistant Examiner* — Stephen G Armstrong
(74) *Attorney, Agent, or Firm* — Cantor Colburn LLP

(57) ABSTRACT

A capacitance voltage conversion circuit, which converts respective capacitances of a plurality of sensor capacitors into voltages, includes: a plurality of capacitance current conversion circuits disposed in respective correspondence with the sensor capacitors, each capacitance current conversion circuit configured to generate a detection current corresponding to a capacitance of a corresponding sensor capacitor; a current average circuit configured to average a plurality of detection currents, which are respectively generated by the capacitance current conversion circuits, to generate an average current; and a plurality of current voltage conversion circuits disposed in respective correspondence with the sensor capacitors, each current voltage conversion circuit configured to convert a difference current between a corresponding detection current and the average current into a voltage.

32 Claims, 9 Drawing Sheets

CAPACITANCE VOLTAGE CONVERSION CIRCUIT, INPUT APPARATUS USING THE SAME, ELECTRONIC INSTRUMENT, AND CAPACITANCE VOLTAGE CONVERSION METHOD

CROSS-REFERENCE TO RELATED APPLICATIONS

This application is based upon and claims the benefit of priority from Japanese Patent Applications Nos. 2011-025019, filed on Feb. 8, 2011, and 2011-182223, filed on Aug. 24, 2011, the entire contents of which are incorporated herein by reference.

TECHNICAL FIELD

The present disclosure relates to a capacitance voltage conversion circuit which is used to measure capacitance.

BACKGROUND

Recent electronic instrument such as computers, portable terminals, and Personal Digital Assistants (PDAs) generally include an input device for manipulating the electronic instrument by touching the input device with a finger or approaching a finger to the input device. As such an input device, joysticks, touch pads, etc. have been known.

Further, as a sensor, capacitance sensors using capacitance have been known. The capacitance sensors may include a sensor electrode. When a user approaches or touches the sensor electrode, capacitance generated by the sensor electrode is changed. By converting the capacitance change into an electric signal with a capacitance voltage conversion circuit, whether a user touches the sensor electrode or not is determined.

Touch panels may be configured with a plurality of sensor electrodes. Touch panels having an X-Y matrix type include row sensor electrodes that are disposed in each row of the matrix, and column sensor electrodes that are disposed in each column of the matrix. By detecting the capacitance change of each of a plurality of sensor electrodes, coordinates touched by a user are specified.

SUMMARY

A conventional capacitance detection circuit generally detects the capacitances of a plurality of sensor electrodes in a time division method. For example, an X-Y matrix type touch panel sequentially detects the capacitances of the column sensor electrodes, and sequentially detects the capacitances of the row sensor electrodes. In such a method, since the timings of capacitance detection for the respective sensor electrodes are different, the sensor electrodes may be respectively affected by different noises.

The present disclosure provides some embodiments of a capacitance voltage conversion circuit that can simultaneously detect the capacitances of a plurality of sensor electrodes.

According to one embodiment of the present disclosure, provided is a capacitance voltage conversion circuit, which converts a capacitance of each of a plurality of sensor capacitors into a voltage, including: a plurality of capacitance current conversion circuits disposed in respective correspondence with the sensor capacitors, each of the capacitance current conversion circuits configured to generate a detection current corresponding to the capacitance of the corresponding sensor capacitor; a current average circuit configured to average the detection currents, which are generated by the capacitance current conversion circuits, to generate an average current; and a plurality of current voltage conversion circuits disposed in respective correspondence with the sensor capacitors, each of the current voltage conversion circuits configured to convert a difference current between the corresponding detection current and the average current into a voltage.

In the present embodiment, each of the detection currents may correspond to a capacitance of a corresponding sensor capacitor, and the average current may correspond to an average capacitance of the capacitances of the sensor capacitors. Therefore, a voltage that is generated by the current voltage conversion circuit of each channel may indicate a difference between the capacitance of the sensor capacitor of each channel and an average capacitance of the capacitances of the sensor capacitors of all channels. According to such a configuration, the capacitances of the respective sensor capacitors can be detected simultaneously.

According to another embodiment of the present disclosure, provided is a capacitance voltage conversion circuit, which converts a capacitance of each of a plurality of sensor capacitors into a voltage, including: a plurality of reset switches disposed in respective correspondence with the sensor capacitors, each of the reset switches configured to initialize an electric potential of a corresponding sensor capacitor; a plurality of integral capacitors disposed in respective correspondence with the sensor capacitors, an electric potential of one end of each integral capacitor being fixed; an initialization circuit configured to initialize respective voltages of the integral capacitors; a plurality of current mirror circuits disposed in respective correspondence with the sensor capacitors, each of the current mirror circuits configured to supply a current, which flows in a second transistor of an output side of each of the current mirror circuits, to a corresponding integral capacitor in a first direction, a first transistor of an input side of each of the current mirror circuits being connected to a corresponding sensor capacitor; and a current average circuit configured to generate an average current of a plurality of detection currents which respectively flow in the sensor capacitors, and supply the average current to the integral capacitors in a second direction.

According to the present embodiment, in each channel, an integral capacitor may be charged (or discharged) by a detection current of a corresponding channel, and the capacitances of the respective sensor capacitors can be simultaneously detected by discharging (or charging) a corresponding capacitor by the average current.

According to another embodiment of the present disclosure, provided is a capacitance voltage conversion circuit, which converts a capacitance of each of a plurality of sensor capacitors into a voltage, including: a plurality of integral capacitors disposed in respective correspondence with the sensor capacitors, an electric potential of one end of each of the integral capacitors being fixed; a plurality of reset switches disposed in respective correspondence with the sensor capacitors, each of the reset switches being connected to a corresponding sensor capacitor in parallel; a plurality of sensing switches disposed in respective correspondence with the sensor capacitors, one end of each of the sensing switches being connected to a corresponding sensor capacitor; a plurality of first transistors, being MOSFETs, disposed in respective correspondence with the sensor capacitors, each of the first transistors being disposed on a path of a corresponding sensing switch; a plurality of second transistors, being MOSFETs, disposed in respective correspondence with the sensor capacitors, a gate of each of the second transistors being connected to a gate of a corresponding first transistor, and a drain of each of the second transistors being connected to a corresponding integral capacitor; a plurality of fifth transistors, being MOSFETs, disposed in respective correspondence with the sensor capacitors, a gate of each of the fifth transistors being connected to a gate of a corresponding first transistor; a plurality of third transistors disposed on a path of a corresponding fifth transistor, in respective correspondence with the sensor capacitors; and a plurality of fourth transistors disposed in respective correspondence with the sensor capacitors, each of the fourth transistors being connected to a corresponding third transistor to form a current mirror circuit therewith, and a drain of each of the fourth transistors being connected to a corresponding integral capacitor.

According to the present embodiment, the capacitances of the respective sensor capacitors can be detected simultaneously.

According to another embodiment of the present disclosure, provided is an input device. The input device may include: a plurality of sensor capacitors; and a capacitance voltage conversion circuit configured to convert a capacitance of each of a plurality of sensor capacitors into a voltage. The sensor capacitors may be disposed in a matrix type.

Moreover, an arbitrary combination of the above elements or a change of an implementation of the present disclosure in methods and devices are effective.

DETAILED DESCRIPTION

Figure 1:
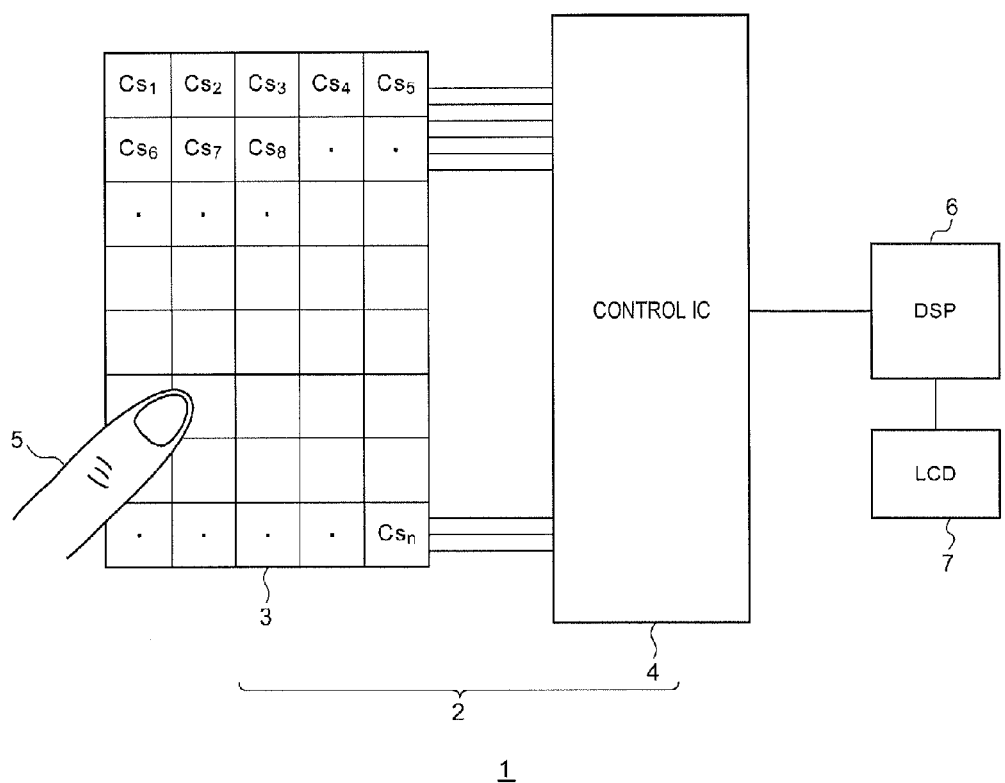
FIG. 1 is a diagram illustrating a configuration of an electronic instrument including an input device according to an embodiment.

Hereinafter, embodiments of the present disclosure will be described with reference to the drawings. The same or equal elements, members, and processing illustrated in each of the drawings are indicated by the same reference numerals, and a repetitive description is not provided. Moreover, the embodiments do not limit the present disclosure but exemplify the present disclosure, and all features described in aspects or combination thereof may or may not be essential to the present disclosure.

In the specification, ⌈a member A being connected to a member B⌋ includes the case where the member A and the member B are physically and directly connected to each other, and the case where the member A and the member B are indirectly connected to each other through another member that does not affect an electrical connection.

Likewise, "a member C being prepared between the member A and the member B" includes the case where the member A and the member C are directly connected to each other or the member B and the member C are directly connected to each other, and the case where the member A and the member C are indirectly connected to each other through another member that does not affect an electrical connection or the member B and the member C are indirectly connected to each other through another member that does not affect an electrical connection.

FIG. 1 is a diagram illustrating a configuration of an electronic instrument 1 including an input device 2 according to an embodiment. The electronic instrument 1 includes a Digital Signal Processor (DSP) 6 and a Liquid Crystal Display (LCD) 7, in addition to the input device 2. The input device 2 includes a touch panel 3 and a control IC 4. The touch panel 3 includes a plurality of sensor capacitors $C_{S1}$ to $C_{Sn}$ that are disposed regularly. The sensor capacitors $C_{S1}$ to $C_{Sn}$ are substantially disposed in a matrix type. The control IC 4 is connected to the sensor capacitors $C_{S1}$ to $C_{Sn}$, detects the capacitances of the sensor capacitors $C_{S1}$ to $C_{Sn}$, and outputs data, indicating each of the capacitances, to the DSP 6.

When a user of the electronic instrument 1 touches the touch panel 3 with a finger 5, a pen or the like, the capacitance of the sensor capacitor $C_S$ corresponding to touched coordinates is changed. The DSP 6 detects the coordinates touched by the user, on the basis of the capacitances of a plurality of sensor capacitors $C_S$. For example, the touch panel 3 may be disposed at a surface of the LCD 7, or disposed at another position of the LCD 7.

The above description has been made on the entire configuration of the electronic instrument 1. Next, the input device 2 will be described in detail.

Figure 2:
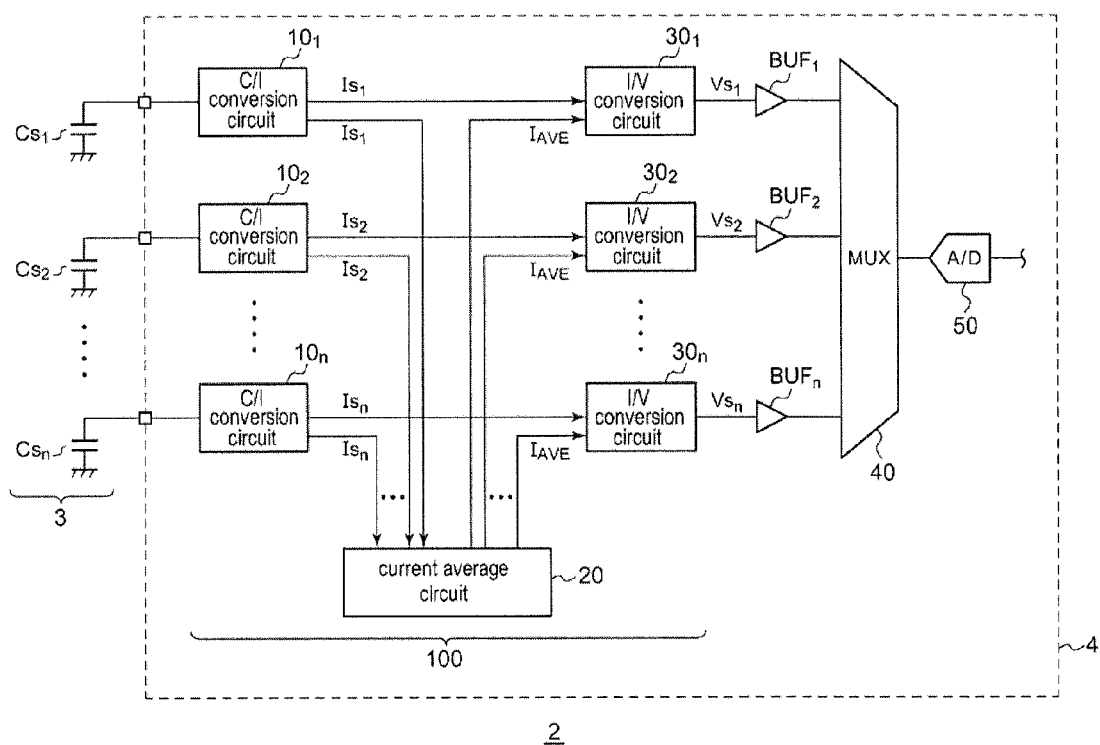
FIG. 2 is a block diagram illustrating a configuration of a control IC according to the embodiment.

FIG. 2 is a block diagram illustrating a configuration of the control IC 4 according to the embodiment. The control IC 4 includes a Capacitance/Voltage conversion circuit (C/V conversion circuit) 100, a multiplexer 40, and an Analog/Digital converter (A/D converter) 50, which are integrated on one semiconductor substrate. A portion of the function of the DSP 6 may also be built in the control IC 4.

The C/V conversion circuit 100 converts the capacitance of each of the sensor capacitors $C_{S1}$ to $C_{Sn}$ into a detection voltage corresponding to the capacitance. As described below, the detection voltages of the respective sensor capacitors $C_S$ are simultaneously generated and held. A plurality of buffers $BUF_1$ to $BUF_n$ respectively receive detection voltages $V_{S1}$ to $V_{Sn}$, and output the received detection voltages to the multiplexer 40. The multiplexer 40 sequentially selects the detection voltages $V_{S1}$ to $V_{Sn}$ in a time division method. The A/D converter 50 sequentially converts the respective detection voltages $V_S$ selected by the multiplexer 40 into digital values $D_{OUT}$.

The C/V conversion circuit 100 converts the capacitances of the sensor capacitors $C_{S1}$ to $C_{Sn}$ into detection voltages $V_{S1}$ to $V_{Sn}$, respectively. The C/V conversion circuit 100 includes a plurality of Capacitance/Current conversion circuits (C/I conversion circuits) $10_1$ to $10_n$, a current average circuit 20, and a plurality of Current/Voltage conversion circuits (I/V conversion circuits) $30_1$ to $30_n$.

The C/I conversion circuits $10_1$ to $10_n$ are disposed in respective correspondence with the sensor capacitors $C_{S1}$ to $C_{Sn}$. The C/I conversion circuit $10_i$ (where $1 \leq i \leq n$) generates a detection current $I_{Si}$ that corresponds to the capacitance of the corresponding sensor capacitor $C_{Si}$, and outputs the detection current $I_{Si}$ to the corresponding I/V conversion circuit $30_i$ and the current average circuit 20.

The current average circuit 20 averages a plurality of the detection currents $I_{S1}$ to $I_{Sn}$ that are respectively generated by the C/I conversion circuits $10_1$ to $10_n$. An averaged detection current $I_{AVE}$ (hereinafter referred to as an average current) is supplied to the I/V conversion circuits $30_1$ to $30_n$:

$$I_{AVE} = \Sigma_{i=1:n} I_{Si}/n \quad (1)$$

The I/V conversion circuits $30_1$ to $30_n$ are disposed in respective correspondence with the sensor capacitors $C_{S1}$ to $C_{Sn}$. The I/V conversion circuit $30_i$ converts a difference current $I_{DIFFi}(=I_{Si}-I_{AVE})$ between the corresponding detection current $I_{Si}$ and the average current $I_{AVE}$ into a voltage, and outputs the converted voltage as the detection voltage $V_{Si}$.

Figure 3:
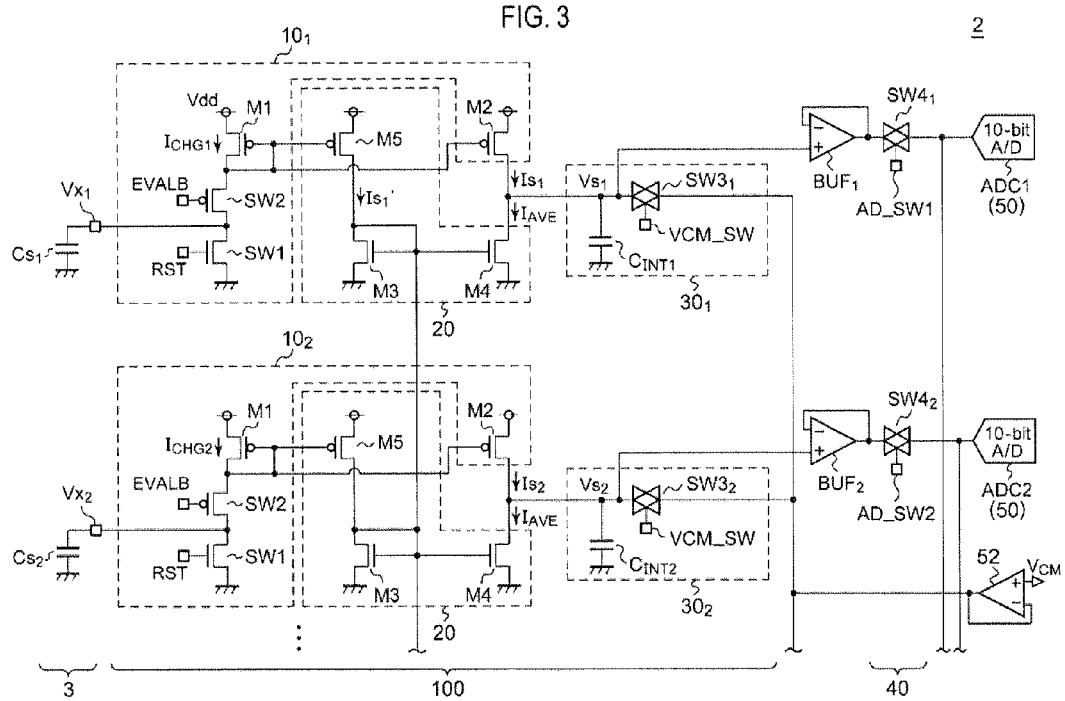
FIG. 3 is a circuit diagram illustrating a detailed configuration example of the control IC.

FIG. 3 is a circuit diagram illustrating a detailed configuration example of the control IC 4. In FIG. 3, only portions respectively corresponding to the sensor capacitors $C_{S1}$ and $C_{S2}$ are illustrated.

The C/I conversion circuit $10_i$ includes a reset switch SW1, a sensing switch SW2, a first transistor M1, and a second transistor M2.

The reset switch SW1 is disposed for initializing the electric charge of a corresponding sensor capacitor $C_{Si}$. For example, the reset switch SW1 may be disposed in parallel to the sensor capacitor $C_{Si}$. When the reset switch SW1 is turned on, the electric charge of the sensor capacitor $C_{Si}$ is discharged and thus initialized. That is, a potential difference between both ends of the sensor capacitor $C_{Si}$ becomes zero. For example, the reset switch SW1 may include an N-channel MOSFET, and when a reset signal RST applied to a gate of the N-channel MOSFET is asserted (high level), the reset switch SW1 is turned on.

The sensing switch SW2 and the first transistor M1 are disposed sequentially and serially between the sensor capacitor $C_{Si}$ and a fixed voltage terminal (herein, a power source terminal). The sensing switch SW2 is a P-channel MOSFET, and when a sensing signal EVALB inputted to a gate of the P-channel MOSFET is asserted (low level), the sensing switch SW2 is turned on.

The first transistor M1 is a P-channel MOSFET. Specifically, a drain of the first transistor M1 is connected to the sensor capacitor $C_{Si}$ through the sensing switch SW2. A source of the first transistor M1 is connected to the power source terminal. In addition, an electric connection is formed between a gate and the drain of the first transistor M1. A charging current $I_{CHGi}$, which corresponds to the capacitance of a corresponding sensor capacitor $C_{Si}$, flows in the first transistor M1.

The second transistor M2 is a P-channel MOSFET of the same type as the first transistor M1, and is connected to the first transistor M1 to form a current mirror circuit therewith. Specifically, a gate of the second transistor M2 is connected to a gate of the first transistor M1, and a source of the second transistor M2 is connected to the power source terminal. A detection current $I_{Si}$, which corresponds to the capacitance of a corresponding sensor capacitor $C_{Si}$, flows in the second transistor M2. When a current ratio (size ratio) of the first and second transistors M1 and M2 is K1, the detection current $I_{Si}$ is expressed as Equation (2):

$$I_{Si} = I_{CHGi} \times K_1 \quad (2)$$

The current mirror circuit configured with the first and second transistors M1 and M2 supplies the detection current $I_{Si}$, flowing in the second transistor M2, to a corresponding integral capacitor $C_{INTi}$ in a first direction (charging direction in FIG. 3).

The current average circuit 20 includes a plurality of third transistors M3, a plurality of fourth transistors M4, and a plurality of fifth transistors M5.

The fifth transistors M5 are disposed in respective correspondence with the sensor capacitors $C_{Si}$. Each of the fifth transistors M5 is a MOSFET of the same type as the first transistor M1, and connected to a corresponding first transistor M1 to form a current mirror circuit therewith, thereby generating a current $I_{Si}'$ which corresponds to a corresponding detection current $I_{Si}$.

The third transistors M3 are disposed on a path of the current $I_{Si}'$ in respective correspondence to the sensor capacitors $C_{Si}$. Control terminals (gates) of the respective third transistors M3 are connected to each other in common. Specifically, a source of each of the third transistors M3 is grounded, and a drain of each of the third transistors M3 is connected to a drain of a corresponding fifth transistor M5.

The fourth transistors M4 are disposed in respective correspondence with the sensor capacitors $C_{Si}$. Each of the fourth transistors M4 is connected to a corresponding third transistor M3 to form a current mirror circuit therewith. The size of each fourth transistor M4 is the same as that of each third transistor M3, in all channels. A current flowing in each fourth transistor M4 is the averaged detection current $I_{AVE}$, and is supplied to a corresponding I/V conversion circuit 30. Specifically, the current average circuits 20 respectively supply a plurality of average currents $I_{AVE}$ to a plurality of integral capacitors $C_{INTi}$ in a second direction (discharging direction in FIG. 3).

Each of the I/V conversion circuits 30 includes an integral capacitor $C_{INTi}$ and an initialization switch $SW3_i$. One end of the integral capacitor $C_{INTi}$ is grounded, and an electric potential thereof is fixed. A corresponding detection current $I_{Si}$ is supplied to the integral capacitor $C_{INTi}$ in the first direction (charging direction), and a corresponding average current $I_{AVE}$ is supplied to the integral capacitor $C_{INTi}$ in the second direction (discharging direction). As a result, the integral capacitor $C_{INTi}$ is charged or discharged by the difference current $I_{DIFFi}(=I_{Si}-I_{AVE})$.

The initialization switch $SW3_i$ functions as an initialization circuit that initializes the voltage of the integral capacitor $C_{INT}$, before detection. One end of the initialization switch $SW3_i$ is connected to the integral capacitor $C_{INT}$, and a reference voltage $V_{CM}$ is applied to the other end of the initialization switch $SW3_i$ by a buffer (voltage follower) 52. The initialization switch $SW3_i$ may be a transfer gate, or may be another switch. When an initialization signal VCM_SW is asserted, the initialization switch $SW3_i$ is turned on. The reference voltage $V_{CM}$, for example, may be a voltage in the vicinity of a central point between a source voltage Vdd and a ground voltage Vss.

In FIG. 3, the multiplexer 40 of FIG. 2 is illustrated as switches $SW4_1$ to $SW4_n$ of respective channels. In addition, in FIG. 3, the A/D converter 50 of FIG. 2 is divided into two A/D converters ADC1 and ADC2. The detection voltages $V_{S1}$, $V_{S3}$, ... of respective odd channels are allocated to the A/D converter ADC1, and the detection voltages $V_{S2}$, $V_{S4}$, ... of respective even channels are allocated to the A/D converter ADC2. The outputs of the respective switches $SW4_1$, $SW4_3$, ... of the odd channels are connected to each other in common, and connected to an input of the A/D converter ADC1. The outputs of the respective switches $SW4_2$, $SW4_4$, ... of the even channels are connected to each other in common, and connected to an input of the A/D converter ADC2. Further, the detection voltage $V_{Si}$ for all channels may be converted into a digital value by a single A/D converter.

Figure 4:
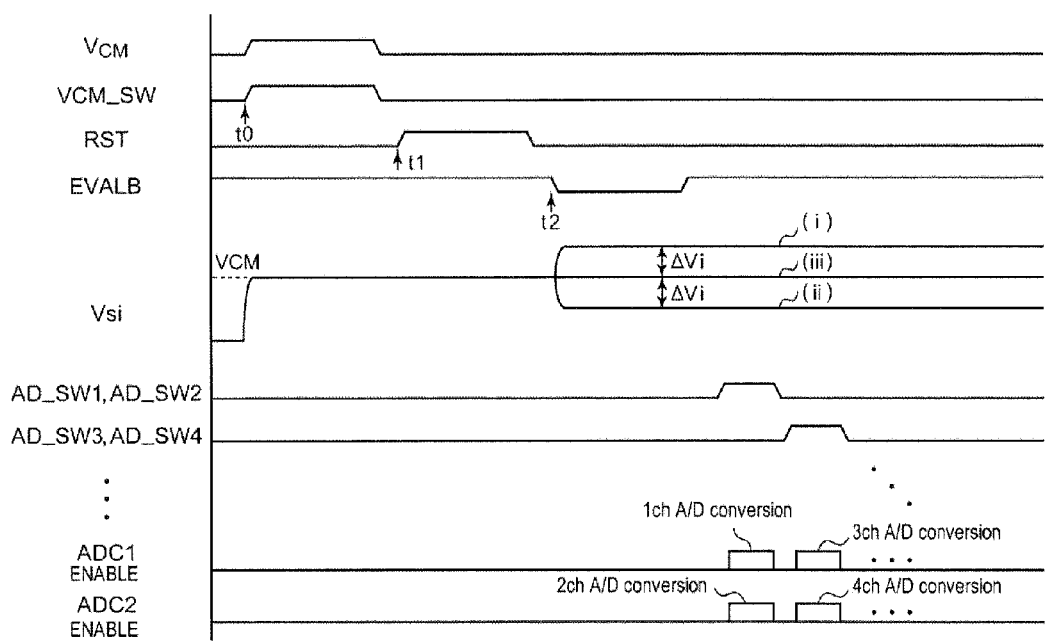
FIG. 4 is a waveform diagram showing an operation of the control IC according to the embodiment.

The above description has been made on the detailed configuration of the control IC 4. Next, an operation of the control IC 4 will now be described. FIG. 4 is a waveform diagram showing the operation of the control IC 4 according to the embodiment.

First, the buffer 52 is turned on, and thus, the reference voltage $V_{CM}$ becomes a certain level. In addition, the initialization signal VCM_SW for all channels is asserted, and thus, the plurality of initialization switches $SW3_1$ to $SW3_n$ are turned on (at time t0). Therefore, the voltage levels of the integral capacitors $C_{INT1}$ to $C_{INTn}$ of the respective channels are initialized to the reference voltage $V_{CM}$. When the initialization of the integral capacitor $C_{INTi}$ is completed, the reference voltage $V_{CM}$ becomes 0 V, and the initialization signal VCM_SW is negated, whereupon the initialization switches $SW3_1$ to $SW3_n$ are turned off.

Subsequently, the reset signal RST is asserted, and the plurality of reset switches $SW1_1$ to $SW1_n$ are turned on. Accordingly, the electric charges of the sensor capacitors $C_{S1}$ to $C_{Sn}$ become zero and thus are initialized (at time t1). Next, the reset signal RST is negated, and the reset switches $SW1_1$ to $SW1_n$ are turned off.

Then, the sensing signal EVALB is asserted (low level), and the plurality of sensing switches $SW2_1$ to $SW2_n$ are turned on.

An ith channel is noted. When the sensing switch $SW2_i$ is turned on, the charging current $I_{CHGi}$ flows through the first transistor M1 and the sensing switch SW2 that correspond to the sensor capacitor $C_{Si}$, thereby boosting the electric potential of the sensor capacitor $C_{Si}$. Then, when the electric potential $V_{Xi}$ rises to Vdd−Vth, the first transistor M1 is turned off, and charging is stopped. Vth is a threshold voltage between a gate and a source of the first transistor M1. An amount of electric charge, which is supplied to the sensor capacitor $C_{Si}$ by the charging, is expressed as Equation (3) below and depends on the capacitance of the sensor capacitor $C_{Si}$.

$$Q_{Si} = C_{Si} \times (Vdd - Vth) \quad (3)$$

That is, the C/I conversion circuit $10_i$ supplies the current $I_{CHGi}$ to a corresponding sensor capacitor $C_S$ until the electric potential of the sensor capacitor $C_{Si}$ reaches a certain level Vdd−Vth.

The C/I conversion circuit $10_i$ copies the charging current $I_{CHGi}$ to generate the detection current $I_{Si}$ corresponding to a capacitance, and charges the integral capacitor $C_{INT}$ with the detection current $I_{Si}$. Since $I_{Si} = K1 \times I_{CHGi}$, an amount of electric charge $Q_{INTi}$ supplied to the integral capacitor $C_{INTi}$ is expressed as Equation (4) below:

$$Q_{INTi} = Q_{Si} \times K1 \quad (4)$$

The current average circuit 20 discharges the integral capacitor $C_{INTi}$ due to an average current $I_{AVE}$ of the detection currents $I_{S1}$ to $I_{Sn}$ of the respective channels. An amount of electric charge $Q_{INTAVE}$, which is discharged from the integral capacitor $C_{INTi}$ by the current average circuit 20, is expressed as Equation (5) below:

$$Q_{INTAVE} = Q_{SAVE} \times K1 \quad (5)$$

where $Q_{SAVE}$ is an average value, $\Sigma Q_{Si}/n$, of the amounts of electric charges that are respectively supplied to the sensor capacitors $C_{S1}$ to $C_{Sn}$ of the respective channels, and expressed as Equation (6) below:

$$Q_{SAVE} = \Sigma Q_{Si}/n = \Sigma C_{Si}/n \times (Vdd - Vth) \quad (6)$$

When the capacitance of the sensor capacitor $C_{Si}$ is greater than an average value $C_{SAVE}$ of the capacitances of the sensor capacitors $C_{S1}$ to $C_{Sn}$ of the respective channels, since $I_{Si} > I_{AVE}$, the integral capacitor $C_{INTi}$ is charged, and the detection voltage $V_{Si}$ becomes higher by $\Delta V_i$ than the reference voltage $V_{CM}$ that is an initial value.

$$\Delta V_i = (Q_{INTi} - Q_{INTAVE})/C_{INTi} \quad (7)$$
$$= (Q_{Si} - Q_{SAVE}) \times K1/C_{INTi}$$
$$= (C_{Si} - \Sigma C_{Si}/n)/C_{INTi} \times K1 \times (Vdd - Vth)$$

However, when the capacitance of the sensor capacitor $C_{Si}$ is less than the average value $C_{SAVE}$, namely, when $Q_{Si} < Q_{SAVE}$, since $I_{Si} < I_{AVE}$, the integral capacitor $C_{INTi}$ is discharged, and the detection voltage $V_{Si}$ becomes lower by $\Delta V_i$ than the reference voltage $V_{CM}$ that is the initial value.

When the capacitance of the sensor capacitor $C_{Si}$ is equal to the average value $C_{SAVE}$, namely, when $Q_{Si} = Q_{SAVE}$, since $I_{Si} < I_{AVE}$, the amount of electric charge of the integral capacitor $C_{INTi}$ is not changed, and $\Delta V_i$ becomes zero.

The final detection voltage $V_{Si}$ is expressed as Equation (8) below:

$$V_{Si} = V_{CM} + \Delta V_i \quad (8)$$
$$= V_{CM} + (C_{Si} - \Sigma C_{Si}/n)/C_{INTi} \times K1 \times (Vdd - Vth)$$

In this way, the capacitance changes of the sensor capacitors $C_{S1}$ to $C_{Sn}$ of the respective channels are respectively converted into the detection voltages $V_{S1}$ to $V_{Sn}$, which are respectively held by the integral capacitors $C_{INT1}$ to $C_{INTn}$.

Subsequently, by controlling the switches $SW4_1$ to $SW4_n$ according to an appropriate sequence, the detection voltages $V_{S1}$ to $V_{Sn}$ of the respective channels are respectively converted into digital values by the two A/D converters ADC1 and ADC2.

The above description has been made on the operation of the control IC 4.

According to the C/I conversion circuit 100, each of the capacitances of the sensor capacitors $C_{S1}$ to $C_{Sn}$ may be detected as a voltage proportional to a difference with respect to the average value $C_{SAVE}(\Sigma C_{Si}/n)$ of the capacitances. Herein, when the number of channels n is sufficiently large and the change of each capacitance is small, the average value $C_{SAVE}$ may be regarded as constant, and thus, the detection voltage $V_{Si}$ is substantially changed linearly according to the capacitance change of the sensor capacitor $C_{Si}$.

The C/I conversion circuit 100 may simultaneously detect the capacitance changes of the respective sensor capacitors $C_S$ of the plurality of channels. Accordingly, even when noise affecting the touch panel 3 is being continuously changed with time, common mode noise can be cancelled, thus enhancing the tolerance to noise compared to a conventional method.

Moreover, as clearly seen in Equation (8), the sensitivity of the detection voltage $V_{Si}$ corresponding to the capacitance change may be adjusted with the mirror ratio K1 of the C/I conversion circuit $10_i$ and current average circuit 20, and the capacitance of the integral capacitor $C_{INTi}$.

The above description has been made on the present disclosure, on the basis of the embodiments. The embodiments are exemplified, and it can be understood by those skilled in the art that various modification examples can be implemented by the combinations of the elements or processors of the embodiments, and are within the technical spirit and scope of the present disclosure. Hereinafter, the modification examples will be described.

First Modification Example

Figure 5:
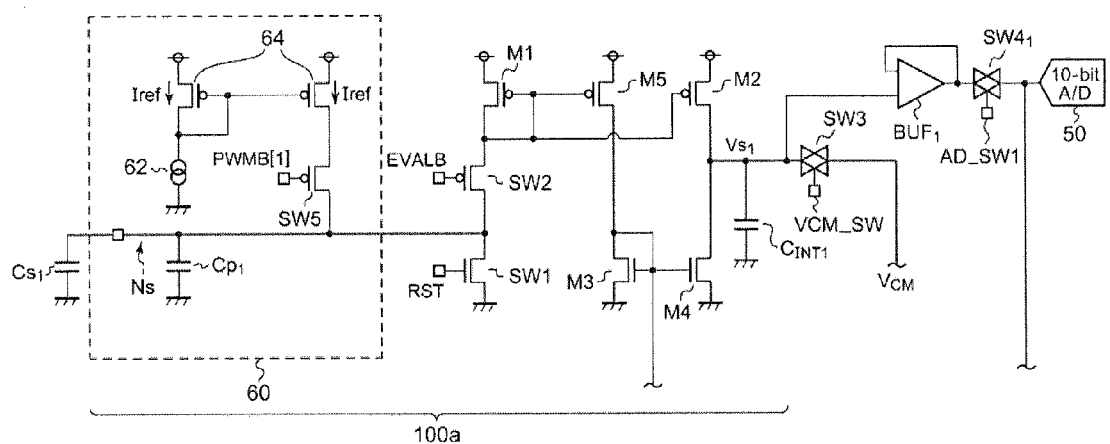
FIG. 5 is a circuit diagram illustrating a first modification example of the control IC.

FIG. 5 is a circuit diagram illustrating a configuration of the control IC 4 according to a first modification example. In FIG. 5, only a configuration of a first channel is illustrated. In an actual circuit, a protection diode or a protection pad (not shown) is directly connected to a terminal $N_S$ to which a sensor capacitor $C_S$ of the control IC 4 is connected, and a parasitic capacitor $C_P$ is formed due to the protection diode or the protection pad.

Specifically, a charging current for the sensor capacitor $C_{Si}$ and a charging current for the parasitic capacitor $C_{Pi}$ flow in the first transistor M1. The charging current flowing in the parasitic capacitor $C_{Pi}$ is supplied as expressed in Equation (9) below:

$$Q_{Pi} = C_{Pi} \times (Vdd - Vth) \quad (9)$$

The electric charge is charged into the integral capacitor $C_{INTi}$. When the parasitic capacitances of parasitic capacitors $C_{P1}$ to $C_{Pn}$ of the respective channels are equal, the influences of the parasitic capacitances are cancelled, but when the parasitic capacitances of the respective channels differ, the parasitic capacitances exert a harmful influence on the detection of the sensor capacitors $C_S$.

Therefore, the control IC 4a of FIG. 5 further includes an offset cancel circuit 60 for cancelling the parasitic capacitor $C_{Pi}$ of each channel. The offset cancel circuit 60 supplies a predetermined reference current Iref to a node (line) $N_S$ to which a corresponding sensor capacitor $C_S$ is connected, for a predetermined duration.

Specifically, the offset cancel circuit 60 includes: a current source 62 that generates the predetermined reference current Iref; a current mirror circuit 64 that copies the reference current Iref and supplies the copied reference current Iref to the node $N_S$; and a cancel switch SW5 that is disposed on a path of a output current of the current mirror circuit 64 and is turned on for the predetermined duration. The cancel switch SW5 is turned on for a duration where a control signal PWMB [1] is asserted (low level).

Figure 6:
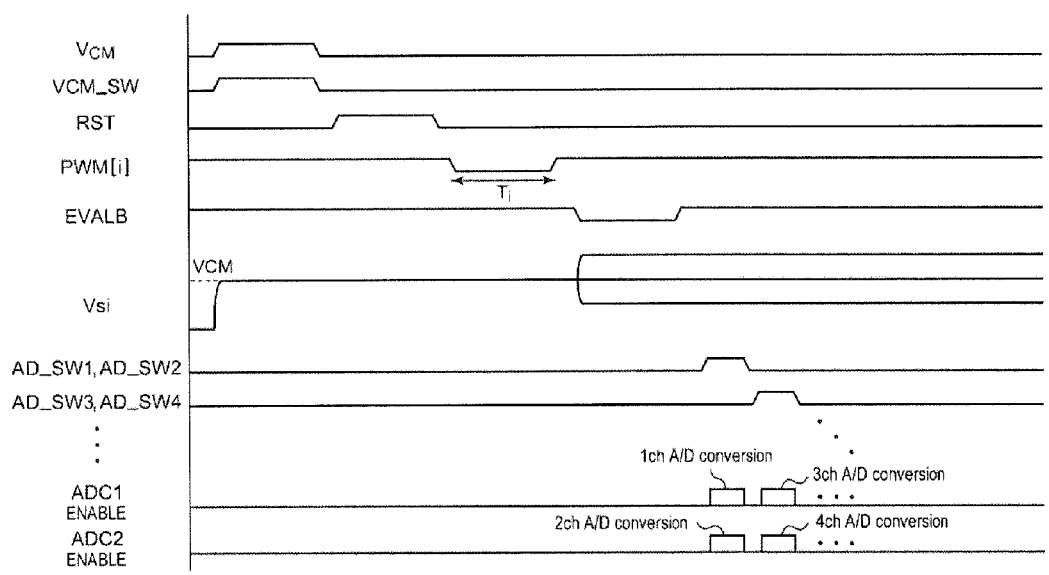
FIG. 6 is a waveform diagram showing an operation of the control IC of FIG. 5.

An operation of the C/V conversion circuit 100a of FIG. 5 will now be described. FIG. 6 is a waveform diagram showing the operation of the control IC 4a of FIG. 5.

Before the sensing signal EVALB is asserted, in each channel, the control signal PWMB[i] is asserted (low level) for an arbitrary calibration duration $T_i$. The calibration durations $T_i$ of the respective channels may differ. In the calibration duration $T_i$, an electric charge expressed in the Equation below is given to the node $N_S$.

$$Q = Iref \times T_i$$

When the amount of the electric charge is equal to $C_{Pi} \times (Vdd-Vth)$, the influence of the parasitic capacitor $C_{Pi}$ may be cancelled. In this case, the calibration duration $T_i$ is provided in the expressed Equation below.

$$T_i = C_{Pi} \times (Vdd-Vth)/Iref$$

The calibration duration $T_i$ may be common in all channels, and the value of a reference current $Iref_i$ may be adjusted for each channel. Alternatively, both the calibration duration $T_i$ and the reference current $Iref_i$ may be adjusted.

In this way, by disposing the offset cancel circuit 60, the influence of the parasitic capacitor $C_{Pi}$ can be cancelled, and the capacitance change of the sensor capacitor $C_{Si}$ can be detected with high precision.

Second Modification Example

The electronic instrument 1 including the input device 2 is switchable between two states, namely, a standby state (slip state) and a normal state. The input device 2 is set to a standby mode in the standby state, and set to a normal mode in the normal state. In the normal mode, the capacitance change of each sensor capacitor $C_S$ of the touch panel 3 is sensed. In the standby mode, in order to reduce the consumption power of the electronic instrument 1, whether a user touches the touch panel 3 is sensed. In the standby mode, when the user touches the touch panel 3, the input device 2 returns to the normal mode. In the present modification example, a description will be made on technology that detects whether the user touches the touch panel 3, at a low consumption power.

As described above, each detection current $I_S$ corresponds to the capacitance of a corresponding sensor capacitor $C_S$, and the average current $I_{AVE}$ corresponds to an average value of the capacitances of the plurality of sensor capacitors $C_S$. When a user touches any one position of the touch panel 3, the average value of the capacitances of the sensor capacitors $C_S$ is changed. Such a principle is applied to an input device 2a according to the second modification example, and the input device 2a determines whether the user touches at least one of the sensor capacitors $C_S$, on the basis of the average current $I_{AVE}$.

Figure 7:
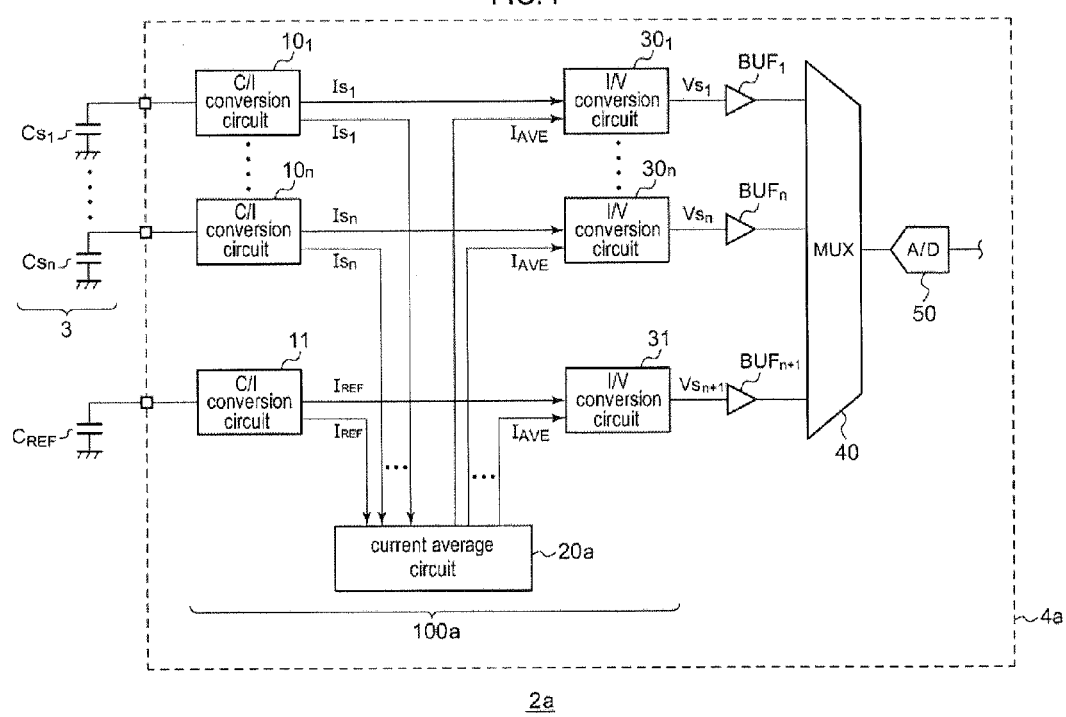
FIG. 7 is a block diagram illustrating a configuration of the control IC according to a second modification example.

FIG. 7 is a block diagram illustrating a configuration of the control IC 4a according to a second modification example. The control IC 4a includes a reference capacitor $C_{REF}$, a second C/I conversion circuit 11, a second I/V conversion circuit 31, and a buffer $BUF_{n+1}$, in addition to the elements of the control IC 4 of FIG. 2.

The second C/I conversion circuit 11 is configured similarly to the C/I conversion circuit 10, and generates a reference current $I_{REF}$ corresponding to the capacitance of the reference capacitor $C_{REF}$. The second I/V conversion circuit 31 is configured similarly to the I/V conversion circuit 30, and converts a difference current $I_{DIFF}(=I_{REF}-I_{AVE})$ between the average current $I_{AVE}$ (which is generated by a current average circuit 20a) and the reference current $I_{REF}$ into a voltage $V_{Sn+1}$.

The current average circuit 20a averages the detection currents $I_S$ generated by the plurality of capacitance current conversion circuit 10 and the reference current $I_{REF}$, thereby generating the average current $I_{AVE}$.

In the present configuration, since the capacitance of the reference capacitor $C_{REF}$ is fixed, the reference current $I_{REF}$ is constant irrespective of whether the user touches the touch panel 3. Therefore, the difference current "$I_{REF}-I_{AVE}$" generated by the second I/V conversion circuit 31 has a value corresponding to the average current $I_{AVE}$. Accordingly, in the standby mode, the input device 2a may determine whether the user touches the touch panel 3, on the basis of the output voltage $V_{Sn+1}$ of the second I/V voltage conversion circuit 31.

In the normal mode, the multiplexer 40 cyclically selects a plurality of voltages $V_{S1}$ to $V_{Sn}$. The A/D converter 50 sequentially converts the voltages $V_{S1}$ to $V_{Sn}$ into respective digital values. In the standby mode, the multiplexer 40 steadily selects the voltage $V_{Sn+1}$ from the second I/V conversion circuit 31. The A/D converter 50 converts only the voltage $V_{Sn+1}$ into a digital value. Thus, in the standby mode, the switching operation of the multiplexer 40 is not required, thus decreasing consumption power.

Moreover, since the A/D converter 50 merely converts the voltage $V_{Sn+1}$ of one channel, consumption power can be considerably reduced compared to a case in which an A/D conversion is performed on all channels. Further, the DSP 6 receiving the output data of the A/D converter 50 detects whether the user touches the touch panel 3 by processing only the voltage $V_{Sn+1}$ of one channel, thus considerably decreasing the number of operations of the DSP 6.

In order to further decrease consumption power, in the standby mode, unnecessary circuit blocks such as I/V conversion circuits $30_1$ to $30_n$ or buffers $BUF_1$ to $BUF_n$ can be stopped.

Figure 8:
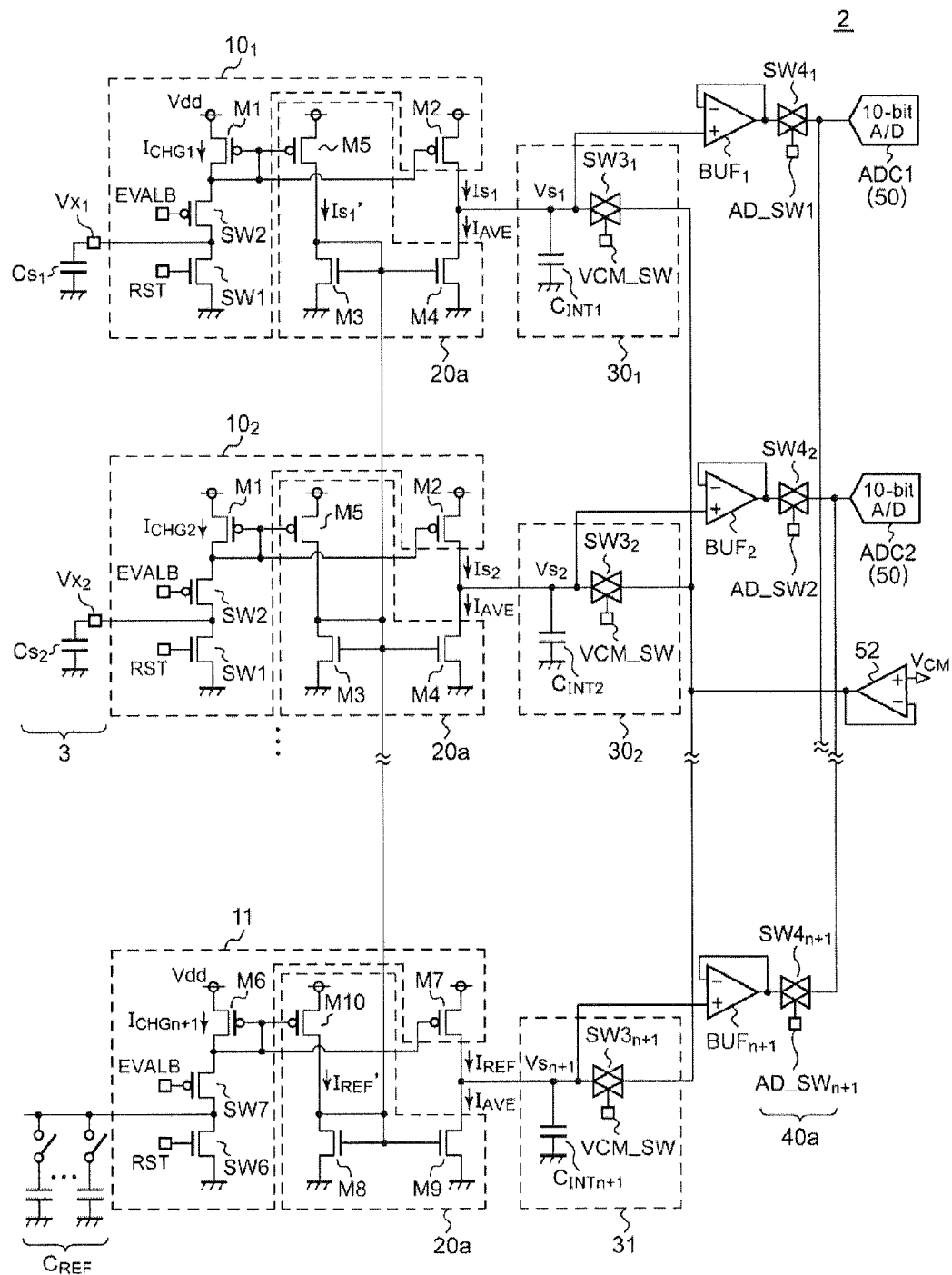
FIG. 8 is a circuit diagram illustrating a detailed configuration example of the control IC of FIG. 7.

FIG. 8 is a circuit diagram illustrating a detailed configuration example of the control IC 4a of FIG. 7.

The control IC 4a includes a second reset switch SW6, a second sensing switch SW7, and a second current mirror circuit.

The second reset switch SW6 is disposed in parallel to the reference capacitor $C_{REF}$, and initializes the electric charge of the reference capacitor $C_{REF}$ when turned on. One end of the second sensing switch SW7 is connected to the reference capacitor $C_{REF}$. A sixth transistor M6 and a seventh transistor M7 configure the second current mirror circuit. The sixth transistor M6 is disposed on a path of the second sensing switch SW7, and is connected to the reference capacitor $C_{REF}$ through the second sensing switch SW7. The second current mirror circuit supplies a current $I_{REF}$, which flows in the seventh transistor M7 of an output side of the second current mirror circuit, to a second integral capacitor $C_{INTn+1}$ in the first direction.

The second integral capacitor $C_{INTn+1}$ is disposed in correspondence with the reference capacitor $C_{REF}$, and the electric potential of one end of the second integral capacitor $C_{INTn+1}$ is fixed. An initialization switch $SW3_{n+1}$, which is a second initialization circuit, is disposed for initializing the voltage of the second integral capacitor $C_{INTn+1}$.

The current average circuit 20a averages a plurality of detection currents $I_{S1}'$ to $I_{Sn}'$ (which flow in the plurality of sensor capacitors $C_{S1}$ to $C_{Sn}$, respectively) and a reference current $I_{REF}'$ flowing in the reference capacitor $C_{REF}$, thereby generating the average current $I_{AVE}$. The current average circuit 20a supplies the average current $I_{AVE}$ to the plurality of integral capacitors $C_{INT1}$ to $C_{INTn}$ and the second integral capacitor $C_{INTn+1}$ in the second direction.

The current average circuit 20a includes an eighth transistor M8, a ninth transistor M9, and a tenth transistor M10, in addition to the elements of the current average circuit 20 of FIG. 3. A gate of the tenth transistor M10 is connected to a gate of the sixth transistor M6. The eighth transistor M8 is disposed on a path of the tenth transistor M10.

The ninth transistor M9 is connected to the eighth transistor M8 to form a current mirror circuit therewith, and a drain of the ninth transistor M9 is connected to the second integral capacitor $C_{INTn+1}$.

In the standby mode, whether a user touches the touch panel 3 is determined on the basis of the voltage $V_{Sn+1}$ of the second integral capacitor $C_{INTn+1}$.

The reference capacitor $C_{REF}$ is built in the control IC 4a, and may be preferably configured as a variable capacitor. As described below, the voltage $V_{Sn+1}$ has a level corresponding to a difference between the capacitance of the reference capacitor $C_{REF}$ and an average capacitance of the capacitances of the sensor capacitors $C_S$. Therefore, by varying the capacitance of the reference capacitor $C_{REF}$, the range of the voltage $V_{Sn+1}$ can be matched with a circuit of a next stage.

Figure 9:
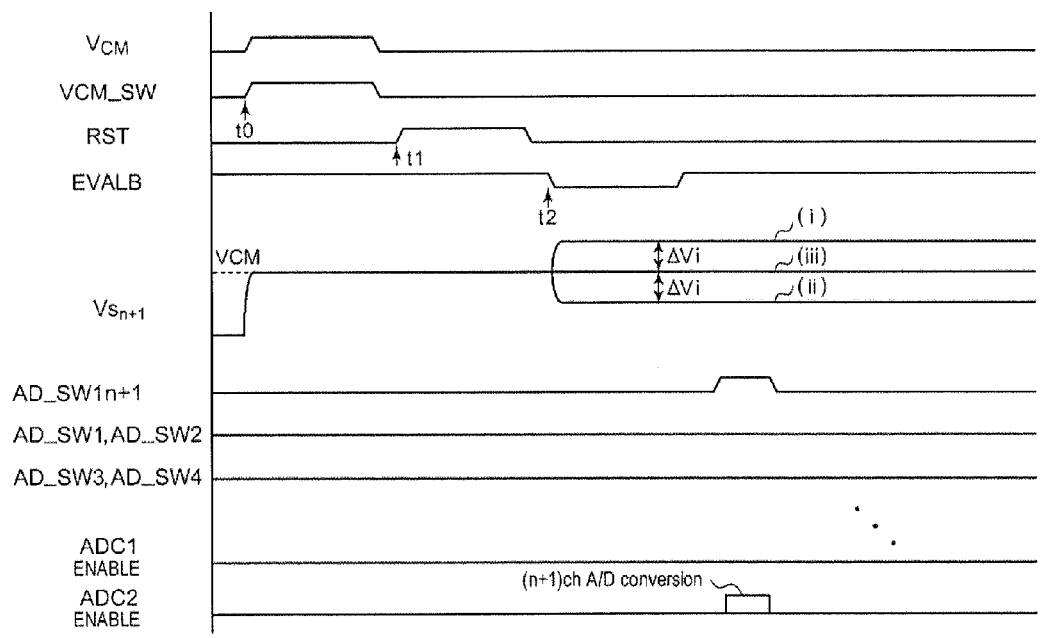
FIG. 9 is a waveform diagram showing an operation of a standby mode of the control IC of FIG. 7.

The above description has been made on the configuration of the control IC 4a. Next, an operation of the control IC 4a will be described. FIG. 9 is a waveform diagram showing an operation in the standby mode of the control IC 4a of FIG. 7.

In the standby mode, an operation before time t2 is as shown in the waveform diagram of FIG. 4.

First, the buffer 52 is turned on, and thus, the reference voltage $V_{CM}$ becomes a certain level. In addition, the initialization signal VCM_SW for all channels is asserted, and thus, the plurality of initialization switch $SW3_1$ to $SW3_{n+1}$ is turned on (at time t0). Therefore, the voltage level of the integral capacitors $C_{INT1}$ to $C_{INTn+1}$ of the respective channels is initialized to the reference voltage $V_{CM}$. When the initialization of the integral capacitor $C_{INT}$ is completed, the reference voltage $V_{CM}$ becomes 0 V, and the initialization signal VCM_SW is negated, whereupon the initialization switches $SW3_1$ to $SW3_n$ are turned off.

Subsequently, the reset signal RST is asserted, and the plurality of reset switches $SW1_1$ to $SW1_n$ and SW6 are turned on. Accordingly, the electric charges of the sensor capacitors $C_{S1}$ to $C_{Sn}$ become zero and thus are initialized (at time t1). Next, the reset signal RST is negated, and the reset switches $SW1_1$ to $SW1_n$ and SW6 are turned off.

Then, the sensing signal EVALB is asserted (low level), and the plurality of sensing switches $SW2_1$ to $SW2_n$ and SW7 are turned on. As a result, the C/I conversion circuit $10_i$ supplies the current $I_{CHGi}$ to the corresponding sensor capacitor $C_{Si}$ until the electric potential of the sensor capacitor $C_{Si}$ reaches a certain level, Vdd–Vth, and the C/I conversion circuit 11 supplies a current $I_{CHGn+1}$ to the corresponding reference capacitor $C_{REF}$ until the electric potential of the reference capacitor $C_{REF}$ reaches the certain level, Vdd–Vth.

An n+1st channel is noted. The current $I_{REF}$, which is supplied to the second integral capacitor $C_{INTn+1}$ in the first direction, has a constant level regardless of whether the user touches the touch panel 3. The current $I_{AVE}$, which is supplied to the second integral capacitor $C_{INTn+1}$ in the second direction, is changed according to whether the user touches the touch panel 3.

When the capacitance of the reference capacitor $C_{REF}$ is equal to an average capacitance of the capacitances of the plurality of sensor capacitors $C_S$, the charging current $I_{REF}$ of the second integral capacitor $C_{INTn+1}$ becomes equal to the discharging current $I_{AVE}$ of the second integral capacitor $C_{INTn+1}$, and thus, the electric potential $V_{Sn+1}$ of the second integral capacitor $C_{INTn+1}$ becomes equal to the reference voltage $V_{CM}$. In addition, when the capacitance of the reference capacitor $C_{REF}$ is greater than the average capacitance of the capacitances of the plurality of sensor capacitors $C_S$, since $I_{REF} > I_{AVE}$, the electric potential $V_{Sn+1}$ of the second integral capacitor $C_{INTn+1}$ becomes equal to the reference voltage $V_{CM}$.

However, when the capacitance of the reference capacitor $C_{REF}$ is less than the average capacitance of the capacitances of the plurality of sensor capacitors $C_S$, since $I_{REF} < I_{AVE}$, the electric potential $V_{Sn+1}$ of the reference capacitor $C_{REF}$ becomes lower than the reference voltage $V_{CM}$.

Herein, when the user touches the touch panel 3, the capacitance of at least one of the sensor capacitors $C_S$ increases, and thus, the average capacitance of the capacitances of the sensor capacitors $C_S$ increases. Accordingly, the electric potential $V_{Sn+1}$ of the reference capacitor $C_{REF}$ has a level that varies according to whether the user touches the touch panel 3.

After the sensing signal EVALB is asserted, a switch AD_SWn+1 of a multiplexer 40a is turned on, and thus, the voltage $V_{Sn+1}$ is inputted to the A/D converter ADC2 and converted into a digital value. The DSP 6 determines whether the user touches the touch panel 3 on the basis of the digital value, and when detecting the touch, the DSP 6 performs the normal mode.

As shown in FIG. 9, in the standby mode, a plurality of switches AD_SW1 to AD_SWn are always turned off, and thus, the multiplexer 40a steadily selects the voltage $V_{Sn+1}$. Accordingly, the switching of the switch is not required. Further, an operation of each of the buffers $BUF_1$ to $BUF_n$ is not required. Additionally, an A/D conversion may be performed only once in an n+1st channel. Moreover, data is transferred from the control IC 4 to the DSP 6 for one channel. Accordingly, the consumption current of the control IC 4 can be greatly reduced.

Further, the DSP 6 determines whether the user touches the touch panel 3 with data for one channel. The determination merely compares digital data, corresponding to the voltage $V_{Sn+1}$ from the DSP 6, with a threshold voltage, and thus is a very simple operation. Accordingly, the number of operations of the DSP 6 can be considerably reduced.

Other Modification Examples

In the above embodiments, the touch panel 3 where the plurality of sensor capacitors $C_S$ are substantially disposed in the matrix type has been described as an example, but the application of the C/V conversion circuit 100 is not limited thereto. For example, the C/V conversion circuit 100 may be applied even to an X-Y type of touch panel, in which case the capacitances of a plurality of row sensor electrodes and the capacitances of a plurality of column sensor electrodes may be detected simultaneously.

The C/V conversion circuit 100, which has been described in the above embodiments, may be switched in its upper and lower positions. In this case, it can be understood by those skilled in the art that the P-channel MOSFETs and the N-channel MOSFETs may be appropriately switched in their disposed positions. Herein, charging and discharging are changed therebetween, but their fundamental operations are not changed. Furthermore, some transistors may be respectively replaced by bipolar transistors instead of MOSFETs.

In the above embodiments, the capacitance voltage conversion circuit 100 has been described as being applied to the input device using the capacitance change, but the use of the capacitance voltage conversion circuit 100 is not limited thereto. For example, the capacitance voltage conversion circuit 100 may be applied to a microphone such as a capacitor type microphone, in which a capacitor is formed by a diaphragm electrode and a back plate electrode and the capacitance of the capacitor is changed by a sound pressure.

Moreover, since the capacitance voltage conversion circuit 100 amplifies and detects a very small capacitance change, the capacitance voltage conversion circuit 100 may be applied to various applications.

In the above embodiments, the capacitance voltage conversion circuit 100 has been described as being integrated on one semiconductor integrated circuit, but is not limited thereto. As another example, each circuit block may be configured with a chip component or a discrete element. The number of blocks to be integrated may be determined according to an applied semiconductor manufacture process, cost, characteristic, etc.

The input device according to the above embodiments may be applied to various electronic instruments, which include various input devices, such as personal computers, PDAs, digital cameras, remote controllers of CD players, etc., in addition to portable terminals that have been described in the above embodiments.

According to the embodiments of the present disclosure, the capacitance voltage conversion circuit can simultaneously detect the capacitances of the plurality of sensor electrodes.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A capacitance voltage conversion circuit which converts a capacitance of each of a plurality of sensor capacitors into a voltage, the capacitance voltage conversion circuit comprising:
a plurality of capacitance current conversion circuits disposed in respective correspondence with the sensor capacitors, each of the capacitance current conversion circuit configured to generate a detection current corresponding to a capacitance of a corresponding sensor capacitor;
a current average circuit configured to average the detection currents, which are generated by the capacitance current conversion circuits, to generate an average current; and
a plurality of current voltage conversion circuits disposed in respective correspondence with the sensor capacitors, each of the current voltage conversion circuit configured to convert a difference current between a corresponding detection current and the average current into a voltage,
wherein each current average circuit comprises:
a plurality of third transistors disposed on a path of the corresponding detection current, in respective correspondence to the sensor capacitors, respective control terminals of the third transistors being connected to each other in common; and
a plurality of fourth transistors disposed in respective correspondence with the sensor capacitors, each fourth transistor connected to a corresponding third transistor to form a current mirror circuit therewith,
wherein the current average circuit outputs a current, flowing in each of the fourth transistors, as the average current.

2. The capacitance voltage conversion circuit of claim 1, wherein each capacitance current conversion circuit comprises:
a reset switch configured to initialize an electric charge of a corresponding sensor capacitor;
a sensing switch and a first transistor disposed sequentially and serially between the corresponding sensor capacitor and a fixed voltage terminal, the first transistor being a MOSFET; and
a second transistor connected to the first transistor to form a current mirror circuit therewith, and
wherein the capacitance current conversion circuit outputs a current, flowing in the second transistor, as the detection current.

3. The capacitance voltage conversion circuit of claim 1, wherein the current average circuit further comprises a plurality of fifth transistors disposed in respective correspondence with the sensor capacitors, each of the fifth transistors connected to a corresponding first transistor to form a current mirror circuit therewith, and each of the third transistors being disposed on a path of a corresponding fifth transistor.

4. The capacitance voltage conversion circuit of claim 1, wherein each of the current voltage conversion circuits comprises an integral capacitor configured to be charged or discharged by the difference current, and an electric potential of one end of the integral capacitor being fixed.

5. The capacitance voltage conversion circuit of claim 4, wherein the current voltage conversion circuit comprises an initialization switch, one end of the initialization switch being connected to the integral capacitor, and a reference voltage being applied to the other end of the initialization switch.

6. The capacitance voltage conversion circuit of claim 1, wherein in a standby mode, whether a user touches at least one of the sensor capacitors is determined on the basis of the average current.

7. A capacitance voltage conversion circuit which converts a capacitance of each of a plurality of sensor capacitors into a voltage, the capacitance voltage conversion circuit comprising:
a plurality of capacitance current conversion circuits disposed in respective correspondence with the sensor capacitors, each of the capacitance current conversion circuit configured to generate a detection current corresponding to a capacitance of a corresponding sensor capacitor;
a current average circuit configured to average the detection currents, which are generated by the capacitance current conversion circuits, to generate an average current;
a plurality of current voltage conversion circuits disposed in respective correspondence with the sensor capacitors, each of the current voltage conversion circuit configured to convert a difference current between a corresponding detection current and the average current into a voltage;
a reference capacitor;
a second capacitance current conversion circuit configured similarly to the capacitance current conversion circuit, and configured to generate a reference current corresponding to a capacitance of the reference capacitor; and
a second current voltage conversion circuit configured similarly to the current voltage conversion circuit, and configured to convert a difference current between the reference current and the average current into a voltage,
wherein the current average circuit averages the reference current and the detection currents which are respectively generated by the plurality of capacitance current conversion circuits, thereby generating the average current.

8. The capacitance voltage conversion circuit of claim 7, wherein in a standby mode, whether a user touches at least one of the sensor capacitors is determined on the basis of an output voltage of the second current voltage conversion circuit.

9. The capacitance voltage conversion circuit of claim 8, further comprising:
a multiplexer configured to receive the respective output voltages of the plurality of current voltage conversion circuits and the output voltage of the second current voltage conversion circuit, and to select one of the received output voltages; and
an A/D converter configured to convert the voltage, selected by the multiplexer, into a digital value,
wherein in the standby mode, the multiplexer selects the output voltage of the second current voltage conversion circuit.

10. The capacitance voltage conversion circuit of claim 9, wherein in the standby mode, the plurality of current voltage conversion circuits are stopped.

11. The capacitance voltage conversion circuit of claim 7, wherein the reference capacitor is a variable capacitor.

12. The capacitance voltage conversion circuit of claim 1, further comprising a plurality of offset cancel circuits disposed in respective correspondence with the sensor capacitors, and configured to supply a predetermined current to a node connected to the corresponding sensor capacitor for a predetermined duration.

13. The capacitance voltage conversion circuit of claim 12, wherein each offset cancel circuit comprises:
a current source configured to generate a predetermined reference current;
a current mirror circuit configured to copy the reference current and supply the copied reference current to the node; and
a cancel switch disposed on a path of an output current of the current mirror circuit, and configured to be turned on for the predetermined duration.

14. The capacitance voltage conversion circuit of claim 1, wherein the capacitance voltage conversion circuit is integrated on one semiconductor integrated circuit.

15. An input apparatus, comprising:
a plurality of sensor capacitors: and
the capacitance voltage conversion circuit of claim 1 configured to convert a capacitance of each of the sensor capacitors into a voltage.

16. The input apparatus of claim 15, wherein the plurality of sensor capacitors are substantially disposed in a matrix type.

17. An electronic instrument, comprising the input apparatus of claim 15.

18. A capacitance voltage conversion circuit which converts a capacitance of each of a plurality of sensor capacitors into a voltage, the capacitance voltage conversion circuit comprising:
a plurality of reset switches disposed in respective correspondence with the sensor capacitors, each of the reset switches configured to initialize an electric potential of a corresponding sensor capacitor;
a plurality of integral capacitors disposed in respective correspondence with the sensor capacitors, an electric potential of one end of each integral capacitor being fixed;
an initialization circuit configured to initialize respective voltages of the integral capacitors;
a plurality of current mirror circuits disposed in respective correspondence with the sensor capacitors, each of the current mirror circuits configured to supply a current, which flows in a second transistor of an output side of each of the current mirror circuits, to a corresponding integral capacitor in a first direction, a first transistor of an input side of each of the current mirror circuits being connected to the corresponding sensor capacitor; and
a current average circuit configured to generate an average current of a plurality of detection currents which respectively flow in the sensor capacitors, and supply the average current to the integral capacitors in a second direction.

19. The capacitance voltage conversion circuit of claim 18, wherein the current average circuit comprises:
a plurality of fifth transistors disposed in respective correspondence with the sensor capacitors, each fifth transistor connected to the first transistor of a corresponding current mirror circuit to form a current mirror circuit therewith;
a plurality of third transistors disposed on a path of a corresponding fifth transistor; and
a plurality of fourth transistors connected to a corresponding third transistor to form a current mirror circuit therewith, wherein the current average circuit supplies the average current, flowing in each of the fourth transistors, to a corresponding integral capacitor.

20. The capacitance voltage conversion circuit of claim 18, wherein the initialization circuit comprises a plurality of initialization switches, one end of each of the initialization switches being connected to a corresponding integral capacitor, and a reference voltage being applied to the other end of each of the initialization switches.

21. The capacitance voltage conversion circuit of claim 18, wherein in a standby mode, whether a user touches at least one of the sensor capacitors is determined on the basis of the average current.

22. The capacitance voltage conversion circuit of claim 18, further comprising:
   a reference capacitor;
   a second integral capacitor disposed in correspondence with the reference capacitor, an electric potential of one end of the second integral capacitor being fixed;
   a second initialization circuit configured to initialize a voltage of the second integral capacitor; and
   a second current mirror circuit configured to supply a current, which flows in a second transistor of an output side of the second current mirror circuit, to the second integral capacitor in a first direction, a first transistor of an input side of the second current mirror circuit being connected to the reference capacitor,
   wherein the current average circuit averages the detection currents flowing in the respective sensor capacitors and a reference current flowing in the reference capacitor to generate the average current, and supplies the average current to the plurality of integral capacitors and the second integral capacitor in a second direction.

23. The capacitance voltage conversion circuit of claim 22, wherein in a standby mode, whether a user touches at least one of the sensor capacitors is determined on the basis of the voltage of the second integral capacitor.

24. The capacitance voltage conversion circuit of claim 23, further comprising:
   a multiplexer configured to receive the respective voltages of the plurality of integral capacitors and the voltage of the second integral capacitor, and to select one of the received voltages; and
   an A/D converter configured to convert the voltage, selected by the multiplexer, into a digital value,
   wherein in the standby mode, the multiplexer selects only the voltage of the second integral capacitor.

25. The capacitance voltage conversion circuit of claim 22, wherein the reference capacitor is a variable capacitor.

26. A capacitance voltage conversion circuit which converts a capacitance of each of a plurality of sensor capacitors into a voltage, the capacitance voltage conversion circuit comprising:
   a plurality of integral capacitors disposed in respective correspondence with the sensor capacitors, an electric potential of one end of each of the integral capacitors being fixed;
   a plurality of reset switches disposed in respective correspondence with the sensor capacitors, each of the reset switches being connected to a corresponding sensor capacitor in parallel;
   a plurality of sensing switches disposed in respective correspondence with the sensor capacitors, one end of each of the sensing switches being connected to the corresponding sensor capacitor;
   a plurality of first transistors, being MOSFETs, disposed in respective correspondence with the sensor capacitors, each of the first transistors being disposed on a path of the corresponding sensing switch;
   a plurality of second transistors, being MOSFETs, disposed in respective correspondence with the sensor capacitors, a gate of each of the second transistors being connected to a gate of a corresponding first transistor, and a drain of each of the second transistors being connected to a corresponding integral capacitor;
   a plurality of fifth transistors, being MOSFETs, disposed in respective correspondence with the sensor capacitors, a gate of each of the fifth transistors being connected to a gate of the corresponding first transistor;
   a plurality of third transistors disposed on a path of a corresponding fifth transistor, in respective correspondence with the sensor capacitors; and
   a plurality of fourth transistors disposed in respective correspondence with the sensor capacitors, each of the fourth transistors being connected to a corresponding third transistor to form a current mirror circuit therewith, and a drain of each of the fourth transistors being connected to the corresponding integral capacitor.

27. The capacitance voltage conversion circuit of claim 26, further comprising:
   a reference capacitor;
   a second integral capacitor disposed in correspondence with the reference capacitor, an electric potential of one end of the second integral capacitor being fixed;
   a second reset switch connected to the reference capacitor in parallel;
   a second sensing switch, one end of the second sensing switch being connected to the reference capacitor;
   a sixth transistor, being a MOSFET, disposed on a path of the second sensing switch;
   a seventh transistor, being a MOSFET, a gate of the seventh transistor being connected to a gate of the sixth transistor, and a drain of the seventh transistor being connected to the second integral capacitor;
   a tenth transistor, being a MOSFET, a gate of the tenth transistor being connected to a gate of the sixth transistor;
   an eighth transistor disposed on a path of the tenth transistor; and
   a ninth transistor connected to the eighth transistor to form a current mirror circuit therewith, and a drain of the ninth transistor being connected to the second integral capacitor.

28. The capacitance voltage conversion circuit of claim 27, wherein in a standby mode, whether a user touches at least one of the sensor capacitors is determined on the basis of a voltage of the second integral capacitor.

29. The capacitance voltage conversion circuit of claim 28, further comprising:
   a multiplexer configured to receive the respective voltages of the plurality of integral capacitors and the voltage of the second integral capacitor, and to select one of the received voltages; and
   an A/D converter configured to convert the voltage, selected by the multiplexer, into a digital value,
   wherein in the standby mode, the multiplexer selects the voltage of the second integral capacitor.

30. The capacitance voltage conversion circuit of claim 27, wherein the reference capacitor is a variable capacitor.

31. A method of converting a capacitance of each of a plurality of sensor capacitors into a voltage, the method comprising:
   initializing an electric potential of each of the sensor capacitors;

supplying a first current until each of the voltages reaches a predetermined level, in correspondence with each of the sensor capacitors;

supplying a second current, which corresponds to a corresponding first current, to an integral capacitor, which is disposed in correspondence with each of the sensor capacitors, in a first direction, and supplying an average current of a plurality of second currents to each of the integral capacitors in a second direction; and outputting a voltage, generated in each of the integral capacitors, as a detection voltage which corresponds to a corresponding capacitance.

32. The method of claim 31, wherein in a standby mode, whether a user touches at least one of the sensor capacitors is determined on the basis of the average current of the second currents.

* * * * *